(12) United States Patent
Dokumaci et al.

(10) Patent No.: US 6,878,978 B2
(45) Date of Patent: Apr. 12, 2005

(54) CMOS PERFORMANCE ENHANCEMENT USING LOCALIZED VOIDS AND EXTENDED DEFECTS

(75) Inventors: Omer H. Dokumaci, Wappingers Falls, NY (US); Dureseti Chidambarrao, Weston, CT (US); Suryanarayan G. Hegde, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/879,538

(22) Filed: Jun. 29, 2004

(65) Prior Publication Data

US 2005/0003604 A1 Jan. 6, 2005

Related U.S. Application Data

(62) Division of application No. 10/248,819, filed on Feb. 21, 2003, now Pat. No. 6,803,270.

(51) Int. Cl.$^7$ .............................................. H01L 27/10
(52) U.S. Cl. ....................... 257/204; 257/351; 257/616; 438/199; 438/301
(58) Field of Search ................................ 257/204, 351, 257/616; 438/199, 301

(56) References Cited

U.S. PATENT DOCUMENTS

| 6,057,581 | A | 5/2000 | Doan |
| 6,075,262 | A | 6/2000 | Moriuchi et al. |
| 6,258,695 | B1 | 7/2001 | Dunn et al. |
| 6,740,913 | B2 * | 5/2004 | Doyle et al. ................. 257/288 |
| 2003/0040158 | A1 * | 2/2003 | Saitoh ......................... 438/279 |

* cited by examiner

*Primary Examiner*—David Nelms
*Assistant Examiner*—Quoc Hoang
(74) *Attorney, Agent, or Firm*—Jay H. Anderson

(57) ABSTRACT

The speed of CMOS circuits is improved by imposing a longitudinal tensile stress on the NFETs and a longitudinal compressive stress on the PFETS, by implanting in the sources and drains of the NFETs ions from the eighth column of the periodic table and hydrogen and implanting in the sources and drains of the PFETs ions from the fourth and sixth columns of the periodic table.

3 Claims, 3 Drawing Sheets

CMOS PERFORMANCE ENHANCEMENT USING LOCALIZED VOIDS AND EXTENDED DEFECTS

This application is a division of application Ser. No. 10/248,819, filed Feb. 21, 2003 now U.S. Pat. No. 6,803,270.

BACKGROUND OF INVENTION

This invention relates to CMOS integrated circuits, and particularly to the fabrication of N-type and P-type field effect transistors (NFETs and PFETs) for improved device performance.

It is known that mechanical stress can affect the performance of semiconductor devices. Specifically, stress affects the mobility of carriers in semiconductors. Individual stress tensor components may cause different effects on the device behavior of PFETs and NFETs respectively. A uniaxial tensile stress, longitudinally applied (that is, in the same direction as the channel current), enhances performance of an NFET but degrades the performance of a PFET. A longitudinally applied compressive stress reverses the effect; it enhances performance of a PFET but degrades that of an NFET. However, a transversely applied unlaxial tensile stress (normal to the direction of the channel current) enhances performance of both NFETs and PFETs simultaneously.

A biaxial stress will improve the NFET to a greater degree than a unlaxial stress, but will not improve the PFET because the two stress components have effects that cancel in the PFET. Previous workers have found that when an in-plane biaxial tensile stress is applied, NFET device performance improves about twofold compared to performance under uniaxial tensile stress, while PFET performance is unchanged.

In order to maximize the performance of both NFET and PFET devices through the application of mechanical stress, the stress components should be applied differently for the two types of devices. Previous attempts to use mechanical stress for device performance enhancement have not improved both NFETs and PFETs simultaneously, order to increase the speed of CMOS circuits, there is a need for a method for providing tension in both the longitudinal and transverse directions (with respect to channel current) for the NFET, while at the same time providing compression in the longitudinal direction and tension in the transverse direction for the PFET.

SUMMARY OF INVENTION

The present invention addresses the above-described need by providing a method of increasing the speed of CMOS circuits by imposing different longitudinal stresses on NFET and PFET devices. In accordance with the present invention, this is done by forming localized extended defects in the semiconductor material to introduce a longitudinal tensile stress for the NFETs while at the same time applying a longitudinal compressive stress for the PFETs.

A feature of the invention is the creation of voids/bubbles in sources and drains of NFETs to impose tensile stress in the body of the NFETs and the creation of dislocation loops or precipitates in sources and drains of PFETs to impose compressive stress in the body of PFETs.

Another feature of the invention is the implantation of elements from the fourth and sixth column of the periodic table in PFETs.

Another feature of the invention is the implantation of noble gases from the eighth column of the periodic table (and hydrogen) in NFETS.

A noteworthy advantage of the present invention is that performance of both NFET and PFET devices is improved simultaneously. It will also be appreciated that the process of the invention may readily be integrated into circuit fabrication processes known in the art. In addition, the present invention may be practiced in the fabrication of structures on bulk, SOI or strained Si substrates, and in both logic and memory devices. Furthermore, the present invention offers the advantage of significant device performance improvement at low cost.

DETAILED DESCRIPTION

Figure 1A:
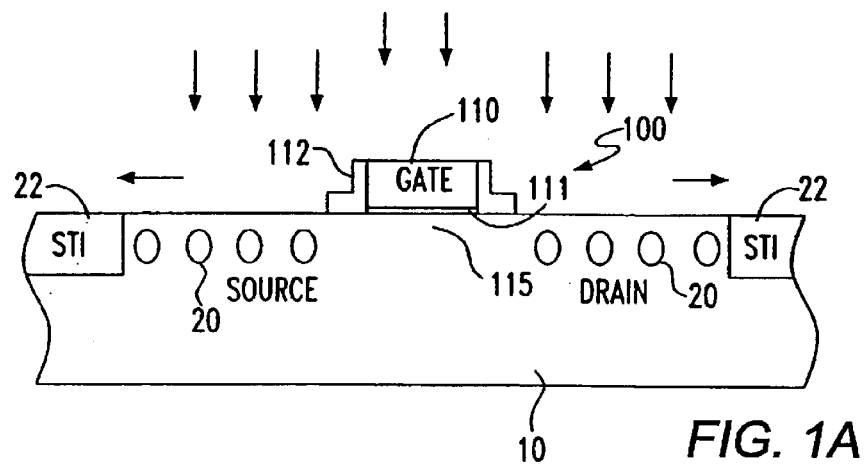
FIGS. 1A and 1B illustrate the implantation of defects that provide appropriate stress in both NFETs and PFETS, respectively.
Figure 1B:
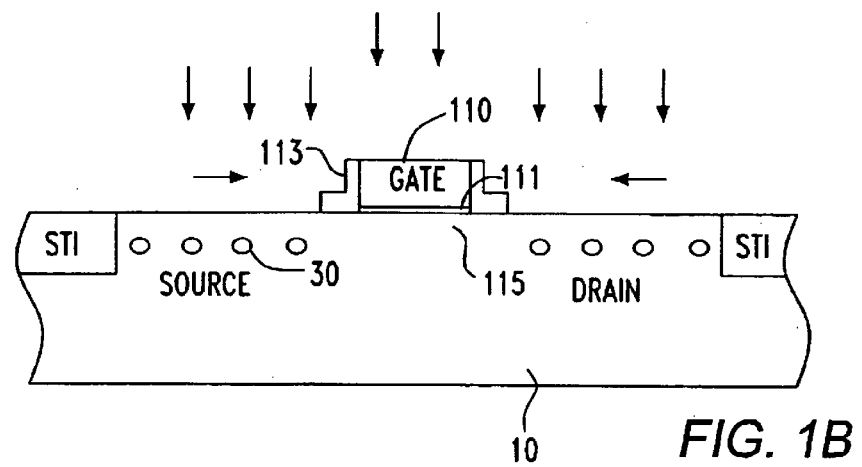

Cross sections of NFETs and PFETs modified according to the invention are illustrated in FIGS. 1A and 1B, respectively. In FIG. 1A, an NFET has been formed in silicon substrate 10 with gate 110 positioned over gate dielectric 111 and transistor body 115 and bracketed by conventional spacers 112. Isolation trenches 22 isolate the transistor from other circuit elements.

Spacers 112 are formed as part of a conventional method of forming low-doped source and drain extensions and/or halo implants. These preliminary steps, including threshold implants, well implants and the like, will be referred to as preparing the substrate. FIG. 1B shows a corresponding cross section for a PFET.

The vertical arrows in FIGS. 1A and 1B schematically illustrate an ion implantation process that creates voids, bubble or vacancy defects 20 (referred to collectively as voids) in the source and drain regions of the NFET, and another implant that creates interstitial defects 30 such as dislocation loops or precipitates (referred to collectively as extrinsic extended defects) in the source and drain regions of the PFET that cause intrinsic compressive stresses in the PFET. The horizontal arrows indicate tensile stress on the gate channel region of the NFET in FIG. 1A, and compressive stress on the gate channel region of the PFET in FIG. 1B. After each of these implant processes, annealing may be performed to cause the extended defects to grow in the substrate.

The process of implantation to form defects may be performed either before or after halo implant, as detailed below.

First Embodiment: Defect Implant After Halo Implant

In the first embodiment of the invention, the implants which produce extended defects and cause the desired stress are performed after preparing the substrate, and in particular after forming the extension/halo regions. A substrate having both NFETs and PFETs (shown in FIGS. 2A and 2B respectively) is prepared, including steps of well doping and formation of isolation structures. The NFETs and PFETs are processed to form gates 110 with gate dielectric 111, and extension/halo doping (not shown in FIGS. 2A and 2B) is then performed. Spacers 113, usually of silicon nitride, are formed on the sides of the gate structures. The techniques and sequence of the above-mentioned steps are known in the art.

Figure 3:
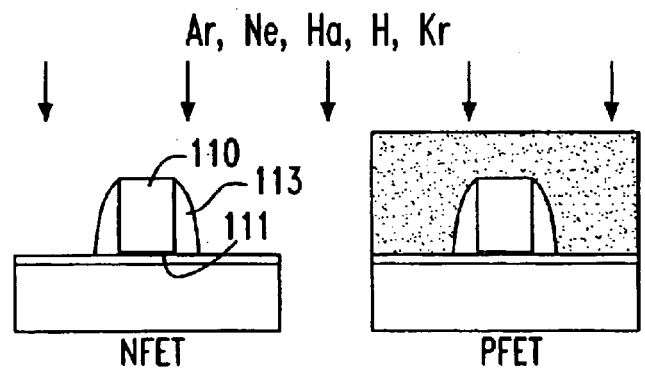
FIG. 3 illustrates an implant process to cause defects in source and drain regions of an NFET.

One polarity of transistor (e.g. the PFET) is blocked by a convenient material such as photoresist and/or an antireflective coating (ARC) stack, and the other polarity is implanted as shown schematically in FIG. 3. In the case of the NFET implant, the implant species is preferably a noble gas (that is, He, Ne, Ar, Kr or Xe from the eighth column of the periodic table) or hydrogen, in order to have no chemical effect on the other dopants for the source and drain. The implant energy is preferably chosen such, that the voids stay within the source and drain (S/D) regions (that is, above the S/D junctions), thereby minimizing leakage to the bulk silicon below. The implant dose is preferably in the range $5 \times 10^{14}/cm^2$ to $5 \times 10^{16}/cm^2$. The magnitude of the implant energy may range from 1 keV to several hundred keV, depending on the implant species and the desired implant depth. (If the invention is implemented in an SOI wafer, this consideration is removed and the implant depth is not restricted.)

After the implant, an optional anneal may be performed to adjust the size of the voids, and hence the amount of stress in the NFET channel. It should be noted that this anneal step requires an additional masking step.

The S/D implant for the NFET is then performed, typically using either P or As (as shown schematically in FIG. 4) to form S/D regions 114. The photoresist coating on the PFET is removed, and the NFET is blocked as shown in FIG. 5. An implant process is then performed which will form dislocation loops in the PFET after annealing. This PFET implant is performed with a dose of Si or Ge (a species that is electrically and chemically neutral), as shown in FIG. 5, or more generally with an element from the fourth or sixth column of the periodic table. The implant dose is preferably in the range $2 \times 10^{14}/cm^2$ to $2 \times 10^{16}/cm^2$. The implant energy may vary from 5 keV to several hundred keV. As with the NFETs, the implant energy is chosen such that the extended defects created during the anneal stay within the range of the S/D and also that the amorphous region created by the implant extends to a greater depth than the amorphous region caused by the S/D implant.

After the implant, an optional anneal may be performed to adjust the size of the dislocation loops, and hence the amount of stress in the PFET channel. It should be noted that this anneal step requires an additional masking step.

The S/D implant for the PFET is then performed, typically using B and/or $BF_2$ (as shown schematically in FIG. 6), to form S/D regions 114'. The coating on the NFET is removed, and an anneal is performed to create bubbles (more generally, voids) 20 in the NFET structure (see FIG. 7A), and to create dislocation loops (more generally, extended extrinsic defects) 30 in the PFET structure (see FIG. 7B). As noted above, the anneal process conditions should be chosen so that the boundary between the S/D regions and the bulk material of the substrate 10 is deeper than the location of the defects (that is, substantially all of the defects remain above the S/D junctions).

Second Embodiment: Disposable Spacer Process

The second embodiment of the invention uses a disposable spacer process. In this embodiment, the implants for creating defects and for forming the S/D regions are performed before the halo and extension implants, so that the extent and distribution of the halo and extension dopants will not be affected by the optional bubble/loop size adjustment anneals.

Figures 2A, 2B:
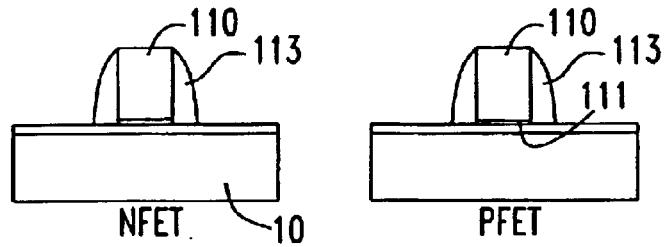
FIGS. 2A and 2B illustrate an NFET and a PFET structure, respectively, on which the method of the present invention is performed.

Referring now to FIGS. 2A and 2B, there are shown sample transistors (NFET and PFET respectively) at a stage before the halo implants. Gates 110 are formed over gate dielectric 111 and dummy spacers 113 are formed on both the NFET and PFET structures.

Figure 4:
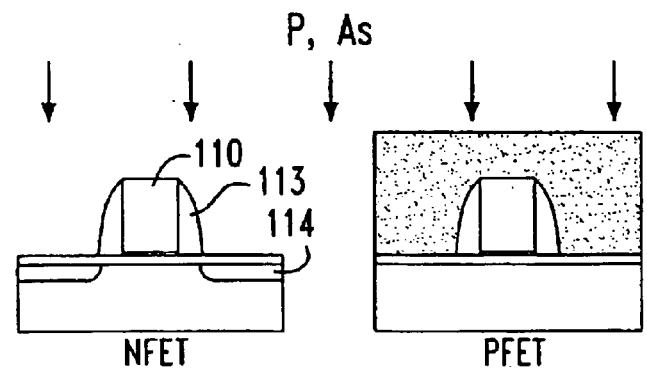
FIG. 4 illustrates a source/drain (S/D) implant process for an NFET.
Figure 5:
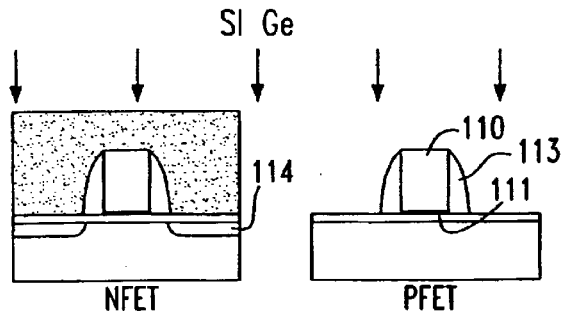
FIG. 5 illustrates an implant process to cause defects in source and drain regions of a PFET.
Figure 6:
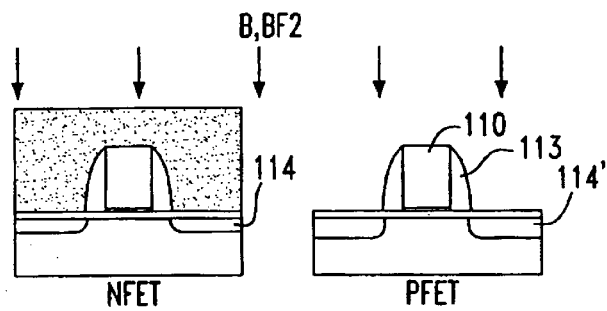
FIG. 6 illustrates a source/drain (S/D) implant process for a PFET.

Implant processes to cause defects and to form the S/D regions are then performed as in the first embodiment (see FIGS. 3–6). FIG. 3 shows the NFET bubble formation implant with the PFET blocked: an optional anneal may be performed at this point to adjust the size of the bubbles and hence the amount of stress in the NFET channel. FIG. 4 shows the NFET S/D implant forming S/D regions 114. The bubble implant is performed with a noble gas or hydrogen as the implant species and the S/D implant is typically performed with P or As as the implant species. The doses and energies are the same as in the first embodiment. Similarly, FIGS. 5 and 6 show the counterpart implants to form dislocation loops and to form S/D regions 114' in the PFET, with the NFET blocked. An optional anneal may be performed after the implant shown in FIG. 5, to adjust the size of the dislocation loops and hence the amount of stress in the PFET channel. As noted above, each optional annealing process requires an additional mask.

Figure 7A:
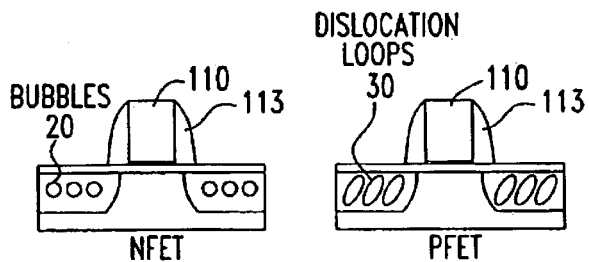
FIGS. 7A and 7B illustrate defects in an NFET and a PFET, respectively, after an anneal is performed, showing completion of a process in accordance with a first embodiment of the invention.
Figure 7B:
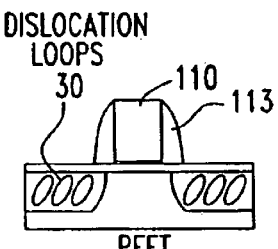

After the PFET S/D implant (FIG. 6), annealing is performed to cause the extended defects to grow. FIGS. 7A and 7B show the NFET and PFET devices after the anneals, with bubbles (more generally, voids) 20 in the NFET and dislocation loops (more generally, extended extrinsic defects) 30 in the PFET.

Figure 8A:
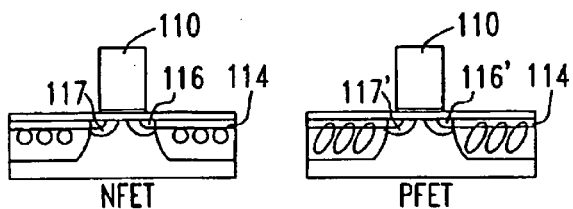
FIGS. 8A and 8B illustrate NFET and PFET devices, respectively, with implanted defects after removing temporary spacers, in accordance with a second embodiment of the invention.
Figure 8B:
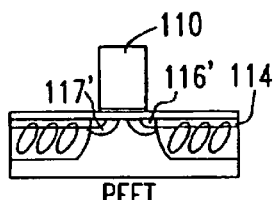

In this embodiment, the disposable spacers 113 are then removed. FIGS. 8A and 8B show NFET and PFET devices, respectively, after spacers 113 are removed and halos 111, 117' and extension areas 116, 116' are formed. Other spacers may be formed in order to provide contact isolation, if desired.

Typical sizes of the extended defects range from about 200 Å to about 700 Å, with areal densities from about $5 \times 10^9/cm^2$ to about $1 \times 10^{11}/cm^2$. The number of point defects in these extended defects (bubbles/voids 20, interstitial loops 30) is believed to be approximately constant through the annealing cycle, and is in accordance with the implant dose.

The stress caused by growth of dislocation loops after annealing may be estimated by assuming that defect growth distributes strain over the thickness of the regrown silicon. For example, if this Si thickness is about 500 Å, and the Si implant dose is typically $1 \times 10^{15}/cm^2$, a typical loop density is $1 \times 10^{10}/cm^2$ with a radius of 300 Å; the expected longitudinal strain is about 0.3%. This is enough to cause stress effects on the band gap and carrier mobility in the device. Larger stresses may be obtained by using higher implant doses.

In the above-described embodiments, implants for NFETs are shown as performed before the corresponding implants for PFETs. The two types of transistors may be processed in reverse order if desired.

Those skilled in the art will appreciate that the method according to the invention is suited to silicon, silicon-geranium alloy, bulk wafers and SOI wafers. Those skilled in the art will also appreciate that the anneals are preferably performed separately, but may be performed simultaneously if the cost saving is deemed to be sufficient.

While the invention has been described in terms of preferred embodiments, those skilled in the art will recognize that the invention can be practiced in various versions within the spirit and scope of the following claims.

What is claimed is:

1. An integrated circuit formed in a semiconductor substrate, comprising:
    a set of PFET and NFET transistors in which at least some of said NFET and PFET transistors have their sources and drains implanted with a substance that produces a stress on bodies thereof, and in which said NFET transistors have an implant that produces a tensile stress in the bodies of said NFETs and in which said PFET transistors have an implant that produces a compressive stress in the bodies of said PFETs.

2. An integrated circuit according to claim 1, in which said NFET transistors have sources and drains implanted with an element selected from the group consisting of elements from the eighth column of the periodic table and hydrogen.

3. An integrated circuit according to claim 1, in which said PFET transistors have sources and drains implanted with an element selected from the group consisting of elements from the fourth and sixth columns of the periodic table.

* * * * *